United States Patent
Omi et al.

(10) Patent No.: US 7,749,800 B2
(45) Date of Patent: Jul. 6, 2010

(54) PHOTOELECTRIC CONVERSION DEVICE, IMAGE SENSOR, AND METHOD OF MANUFACTURING A PHOTOELECTRIC CONVERSION DEVICE

(75) Inventors: Toshihiko Omi, Chiba (JP); Yoichi Mimuro, Chiba (JP)

(73) Assignee: Seiko Instruments Inc., Chiba (JP)

( * ) Notice: Subject to any disclaimer, the term of this patent is extended or adjusted under 35 U.S.C. 154(b) by 637 days.

(21) Appl. No.: 11/713,413

(22) Filed: Mar. 2, 2007

(65) Prior Publication Data
US 2007/0210397 A1 Sep. 13, 2007

(30) Foreign Application Priority Data
Mar. 3, 2006 (JP) ............... 2006-057550

(51) Int. Cl.
*H01L 21/00* (2006.01)
(52) U.S. Cl. .................. 438/94; 257/463; 257/E31.067
(58) Field of Classification Search ................. 257/461, 257/463, E31.067; 438/94
See application file for complete search history.

(56) References Cited

U.S. PATENT DOCUMENTS

| 6,049,118 | A  | * | 4/2000  | Nagano .................. 257/462 |
| 6,433,374 | B1 | * | 8/2002  | Fukunaga et al. .......... 257/292 |
| 7,151,305 | B2 | * | 12/2006 | Kozuka et al. ............. 257/431 |
| 7,531,857 | B2 | * | 5/2009  | Park ........................ 257/291 |
| 7,589,366 | B2 | * | 9/2009  | Suzuki ..................... 257/294 |

FOREIGN PATENT DOCUMENTS

JP    2002-170945 A    6/2002

\* cited by examiner

*Primary Examiner*—Allan R. Wilson
(74) *Attorney, Agent, or Firm*—Brinks Hofer Gilson & Lione

(57) ABSTRACT

Provided is a photoelectric conversion device including: a semiconductor substrate (3) of a first conductivity type; a photoelectric conversion region (7) of a second conductivity type which is located in the semiconductor substrate (3), the second conductivity type being opposite to the first conductivity type; and a buried layer (17) of the first conductivity type which is formed in an inner portion of the semiconductor substrate (3) to cover a lower side of the photoelectric conversion region (7), the buried layer (17) including a higher impurity concentration than the semiconductor substrate (3).

3 Claims, 8 Drawing Sheets

PHOTOELECTRIC CONVERSION DEVICE, IMAGE SENSOR, AND METHOD OF MANUFACTURING A PHOTOELECTRIC CONVERSION DEVICE

This application claims priority under 35 U.S.C. §119 to Japanese Patent Application No. JP2006-057550 filed Mar. 3, 2006, the entire content of which is hereby incorporated by reference.

BACKGROUND OF THE INVENTION

1. Field of the Invention

The present invention relates to a photoelectric conversion device, an image sensor, and a method of manufacturing a photoelectric conversion device.

2. Description of the Related Art

Up to now, a CMOS image sensor is constructed from a photoelectric conversion device, in which a large number of photoelectric conversion elements are arranged as pixels, and a CMOS circuit for processing signal charges from the photoelectric conversion device, both provided on a semiconductor substrate such as a silicon substrate (see, for example, JP 2002-170945 A).

Each of the pixels of the photoelectric conversion device is made by: a semiconductor layer of a first conductivity type (for example, P-type) which is formed on a semiconductor substrate of a first conductivity type (for example, $P^+$-type) and which has a lower first conductivity type impurity concentration than the semiconductor substrate; and a photoelectric conversion region (for example, N-type region) which is formed as a photoelectric conversion element of a second conductivity type in an upper side position of the first conductivity type layer. That is, the semiconductor substrate and the photoelectric conversion region construct a photodiode serving as a pixel. The semiconductor layer of the first conductivity type is made from an epitaxial layer.

In the case of the above-mentioned structure, annihilation of electrons which diffuse toward the semiconductor substrate in a part of photoelectrons generated in the first conductivity type layer takes place through recombination in the semiconductor substrate and can contribute to reduction in crosstalk of electrical charge to adjacent pixels and an image lag in which photoelectrons reach the same pixel with a time difference equal to or longer than a predetermined time.

The CMOS circuit includes, for example, a first conductivity type or second conductivity type MOS transistor. In particular, when the first conductivity type MOS transistor (for example, PMOS transistor) is to be provided to the semiconductor substrate, a second conductivity type well (for example, N-well) which reaches from a surface of the first conductivity type layer to a surface of the semiconductor substrate is formed.

However, since the semiconductor layer formed on the semiconductor substrate is an epitaxial layer, a manufacturing cost for the photoelectric conversion device becomes higher.

Formation of a PN junction of the second conductivity type well of the MOS transistor with the semiconductor substrate having a higher first conductivity type impurity concentration than the first conductivity type semiconductor layer results in a relatively high impurity concentration of the PN junction, which reduces an electrical withstand voltage of the second conductivity type well.

SUMMARY OF THE INVENTION

The present invention has been made in view of the above-mentioned circumstances. An object of the present invention is to provide a photoelectric conversion device capable of reducing crosstalk or an image lag to reduce a manufacturing cost, a method of manufacturing a photoelectric conversion device, and an image sensor including the photoelectric conversion device.

Another object of the present invention is to provide a method of manufacturing a photoelectric conversion device with which an electrical withstand voltage of a second conductivity type well of a MOS transistor can be increased.

In order to solve the above-mentioned problems, according to the present invention, the following means is proposed.

According to a first aspect of the present invention, there is provided a photoelectric conversion device including: a semiconductor substrate of a first conductivity type; a photoelectric conversion region of a second conductivity type which is located in the semiconductor substrate, the second conductivity type being opposite to the first conductivity type; and a buried layer of the first conductivity type which is formed in an inner portion of the semiconductor substrate to cover a lower side of the photoelectric conversion region, the buried layer including a higher impurity concentration than the semiconductor substrate.

According to the photoelectric conversion device, photoelectrons generated on a lower side of the semiconductor substrate than the buried layer can be annihilated by recombination in the buried layer.

Further, according to the first aspect of the present invention, in the photoelectric conversion device, the buried layer and the photoelectric conversion region are located with a gap therebetween.

According to a second aspect of the present invention, there is provided an image sensor including: the photoelectric conversion device; and a MOS transistor of the first conductivity type which is provided to the semiconductor substrate, the MOS transistor including a well of the second conductivity type, in which the well of the MOS transistor is separated from the buried layer.

According to the image sensor, a relative impurity concentration of the PN junction can be set to a value lower than that in a conventional case since the well of the second conductivity type which is included in the MOS transistor is separated from the buried layer for reducing crosstalk of electrical charge and an image lag, and forms a PN junction with the semiconductor substrate having the lower impurity concentration of the first conductivity type than the buried layer.

According to a third aspect of the present invention, there is provided a method of manufacturing a photoelectric conversion device including: a photoelectric conversion region forming step of forming, in a semiconductor substrate of a first conductivity type, a photoelectric conversion region of a second conductivity type opposite to the first conductivity type; and a buried layer forming step of forming a buried layer of the first conductivity type in an inner portion of the semiconductor substrate to cover a lower side of the photoelectric conversion region, the buried layer including a higher impurity concentration than the semiconductor substrate.

According to the method of manufacturing a photoelectric conversion device, in the photoelectric conversion region forming step, ion implantation or the like is performed while a photoresist pattern for specifying a region in which the photoelectric conversion region is to be formed is formed on the semiconductor substrate. The photoelectric conversion region can therefore be formed at a predetermined position in the semiconductor substrate. After the photoelectric conversion region forming step is completed, the buried layer forming step is performed while the photoresist pattern is left. Consequently, the buried layer can only be formed under the photoelectric conversion region.

Because the buried layer can only be formed under the photoelectric conversion region, even when the well of the second conductivity type which is included in the MOS transistor of the first conductivity type is formed in the same semiconductor substrate, the well is not brought into contact with the buried layer. That is, the well of the second conductivity type forms a PN junction with the semiconductor substrate having the lower impurity concentration of the first conductivity type than the buried layer. A relative impurity concentration of the PN junction can therefore be set to a value lower than that in a conventional case.

In the photoelectric conversion device manufactured as described above, photoelectrons generated on the lower side of the semiconductor substrate than the buried layer can be annihilated by recombination in the buried layer.

Further, according to the third aspect of the present invention, the method further includes a shield layer forming step of forming a shield layer of the second conductivity type on the photoelectric conversion region, the shield layer being electrically connected with the semiconductor substrate, and in the method, the shield layer forming step is performed immediately before the buried layer forming step.

In the photoelectric conversion device manufactured as described above, when electrical noise reaches the shield layer from the outside, the noise can be transferred to the semiconductor substrate. That is, the shield layer has a function of preventing the electrical noise from entering the photoelectric conversion region from the outside.

In the shield layer forming step, ion implantation or the like is performed while a photoresist pattern for specifying a region in which the shield layer is to be formed is formed on the semiconductor substrate. The shield layer can therefore be formed at a predetermined position on the photoelectric conversion region. After the shield layer forming step is completed, the buried layer forming step is performed while the photoresist pattern is left. Consequently the buried layer can only be formed under the photoelectric conversion region.

According to the present invention, annihilation of the photoelectrons generated in the lower side of the semiconductor substrate than the buried layer can be made in the buried layer, resulting in reduction in crosstalk of electrical charge to another photoelectric conversion region adjacent to the photoelectric conversion region and an image lag in which the photoelectrons reach the same pixel with a time difference equal to or longer than a predetermined time.

The photoelectric conversion region can be directly formed in the semiconductor substrate. That is, unlike the conventional case, no need for forming an epitaxial layer leads to the reduction in manufacturing cost of the photoelectric conversion device.

Formation of a gap between the photoelectric conversion region and the buried layer makes the entire lower surface of the photoelectric conversion region contact with the semiconductor substrate, enabling construction of a photodiode having high photoelectric conversion efficiency with the photoelectric conversion region and the semiconductor substrate.

When the MOS transistor is provided in addition to the photoelectric conversion device, a low setting value for the relative impurity concentration of the PN junction between the semiconductor substrate of the first conductivity type and the well of the second conductivity type enables improvement in an electrical withstand voltage of the well of the second conductivity type, while reducing the crosstalk and the image lag.

Performing the buried layer forming step immediately after the photoelectric conversion region forming step or the shield layer forming step enables formation of the buried layer using the same photoresist pattern as that for the photoelectric conversion region or the shield layer, improving the manufacturing efficiency of the photoelectric conversion device.

Formation of the shield layer on the photoelectric conversion region can prevent the electrical noise from entering the photoelectric conversion region from the outside, also preventing reduction in image quality caused by the noise.

DETAILED DESCRIPTION OF THE PREFERRED EMBODIMENTS

Figure 1:
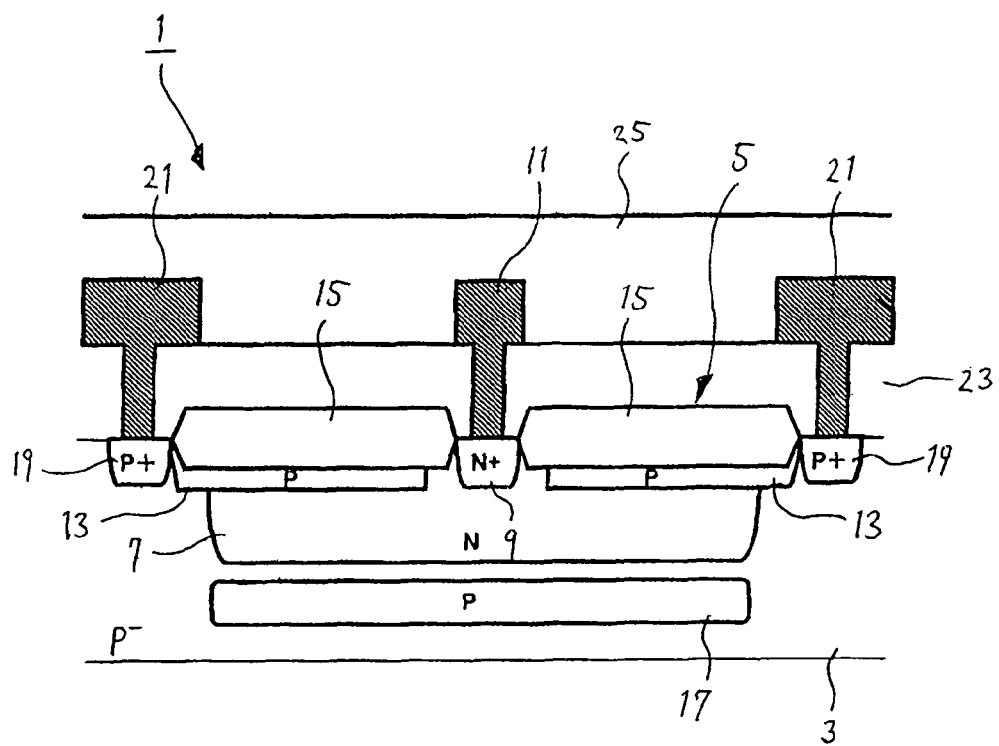
FIG. 1 is a schematic cross sectional view showing a photoelectric conversion device according to a first embodiment of the present invention.

FIGS. 1 to 6 show a first embodiment of the present invention. As shown in FIG. 1, an image sensor according to this embodiment includes a photoelectric conversion device 1 in which a large number of pixels 5 are arranged to a semiconductor substrate 3 of a P-type which is a first conductivity type (hereinafter referred to as P⁻-type semiconductor substrate 3).

In each of the pixels 5 of the photoelectric conversion device 1, a photoelectric conversion region 7 of an N-type which is a second conductivity type is located in the P⁻-type semiconductor substrate 3. The P⁻-type semiconductor substrate 3 and the N-type photoelectric conversion region 7 compose a photodiode. An impurity concentration of the P⁻-type semiconductor substrate 3 is, for example, $1 \times 10^{15}/cm^3$. An impurity concentration of the N-type photoelectric conversion region 7 is, for example, $5 \times 10^{15}/cm^3$.

An N⁺ layer 9 having a higher impurity concentration than the photoelectric conversion region 7 and a metal line 11 extending upward from the N+ layer 9, such as an aluminum line, are formed in an upper surface of the P⁻-type semiconductor substrate 3 which is located above the photoelectric conversion region 7. The metal line 11 is connected with a CMOS circuit (not shown) provided outside the photoelectric conversion device 1. That is, the N⁺ layer 9 and the metal line 11 have a function of transferring a signal charge stored in the photoelectric conversion region 7 to the CMOS circuit. Note that the CMOS circuit is, for example, provided to the upper surface of the P⁻-type semiconductor substrate 3.

In each of the pixels 5, a P-type shield layer 13 and a field oxide film 15 are stacked in this order on a portion of the N-type photoelectric conversion region 7 which is other than a region in which the N⁺ layer 9 is formed.

Since the P-type shield layer 13 is electrically connected to the P⁻-type semiconductor substrate 3, when electrical noise reaches the shield layer 13 from the outside, the noise is transferred to the P⁻-type semiconductor substrate 3. That is, the shield layer 13 has a function of preventing the electrical noise from entering the photoelectric conversion region 7. In addition, the shield layer 13 has a function of reducing a leak current on the upper surface of the P⁻-type semiconductor substrate 3. Note that an impurity concentration of the P-type shield layer 13 is higher than the impurity concentration of the P⁻-type semiconductor substrate 3 and becomes, for example, $8 \times 10^{16}/cm^3$.

In each of the pixels 5, a P-type buried layer 17 is formed in an inner portion of the P⁻-type semiconductor substrate 3 so as to cover a lower side of the photoelectric conversion region 7. The P-type buried layer 17 is located with a gap from the photoelectric conversion region 7. An impurity concentration of the P-type buried layer 17 is higher than the impurity concentration of the P⁻-type semiconductor substrate 3 and becomes, for example, $5 \times 10^{16}/cm^3$.

A P-type P⁺ separation region 19 for electrically separating the adjacent pixels 5 from one another and a circular metal line 21 extending upward from the P-type P⁺ separation region 19, such as an aluminum line, are formed in and on a portion of the upper surface of the P⁻-type semiconductor substrate 3 which is located around each of the pixels 5, each of which has the above-mentioned structure.

The P⁺ separation region 19 is electrically connected with the shield layer 13 in addition to the P⁻-type semiconductor substrate 3. An impurity concentration of the P⁺ separation region 19 is higher than the impurity concentration of the shield layer 13. The circular metal line 21 is made of, for example, aluminum. The circular metal line 21 is connected with a power source (not shown) and held at a predetermined potential. The circular metal line 21 has a function of specifying the region of the pixel 5 and a light shielding function.

An interlayer insulating film 23 and an insulating protective film 25, each of which is made of an electrical insulating material, are stacked in this order on the entire upper surface of the P⁻-type semiconductor substrate 3 including the field oxide film 15, the N⁺ layer 9, and the P⁺ separation region 19. The metal line 11 connected with the N⁺ layer 9 and the circular metal line 21 connected with the P⁺ separation region 19 protrude from an upper surface of the interlayer insulating film 23 and protruding portions thereof are coated with the insulating protective film 25.

Next, a method of manufacturing a photoelectric conversion device 1 will be described below.

Figure 2:
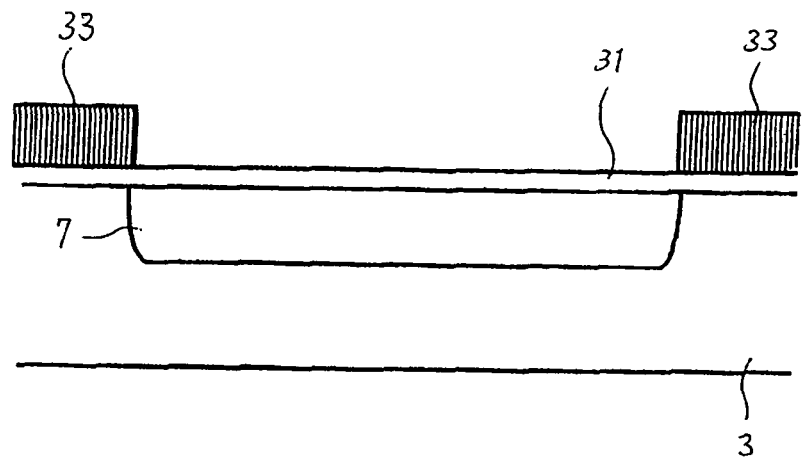
FIG. 2 is a schematic cross sectional view showing a method of manufacturing a photoelectric conversion device shown in FIG. 1.

When the photoelectric conversion device 1 is to be manufactured, as shown in FIG. 2, a silicon oxide film 31 whose thickness is 300 angstroms is first formed in the upper surface of the P⁻-type semiconductor substrate 3 (oxide film forming step). Next, using photoresist 33 formed on the upper surface of the silicon oxide film 31 and having a pattern for defining a formation region for the photoelectric conversion region 7 as a mask, phosphorous ions are implanted to form the N-type photoelectric conversion region 7 on the upper surface side of the P⁻-type semiconductor substrate 3 (photoelectric conversion forming step).

Figure 3:
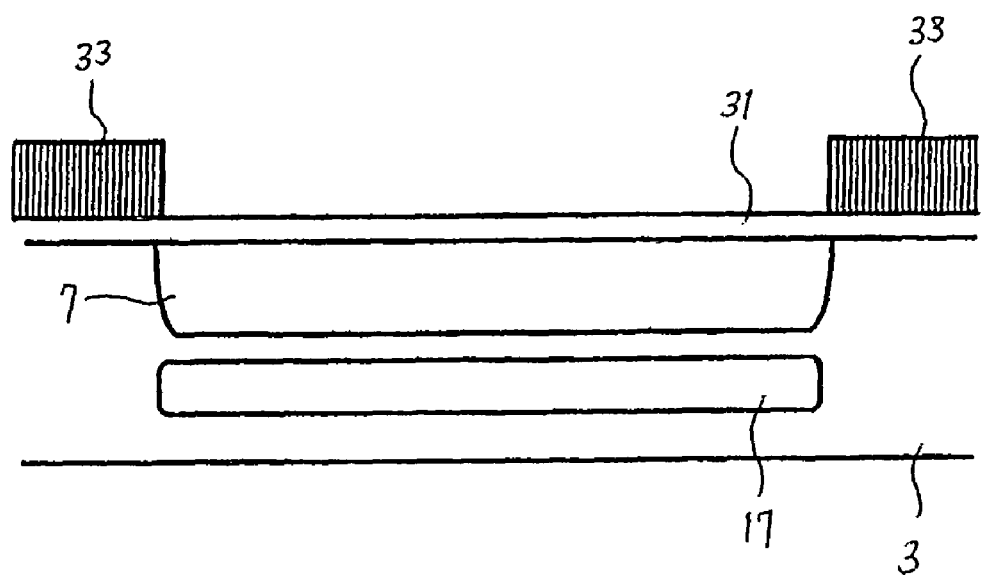
FIG. 3 is a schematic cross sectional view showing the method of manufacturing a photoelectric conversion device shown in FIG. 1.

Then, as shown in FIG. 3, leaving the photoresist 33, boron ions are introduced by ion-implantation, for example, at energy of 1.2 MeV to form the P-type buried layer 17 under the photoelectric conversion region 7 (buried layer forming step). In this step, formation of the buried layer 17 using the pattern of the photoresist 33 for the photoelectric conversion region 7 results in the formation of the buried layer 17 only under the photoelectric conversion region 7. Performing the ion implantation at the predetermined energy enables the formation of the buried layer 17 with a gap from the photoelectric conversion region 7.

After the completion of the buried layer forming step, the photoresist 33 for the photoelectric conversion region 7 is removed.

Figure 4:
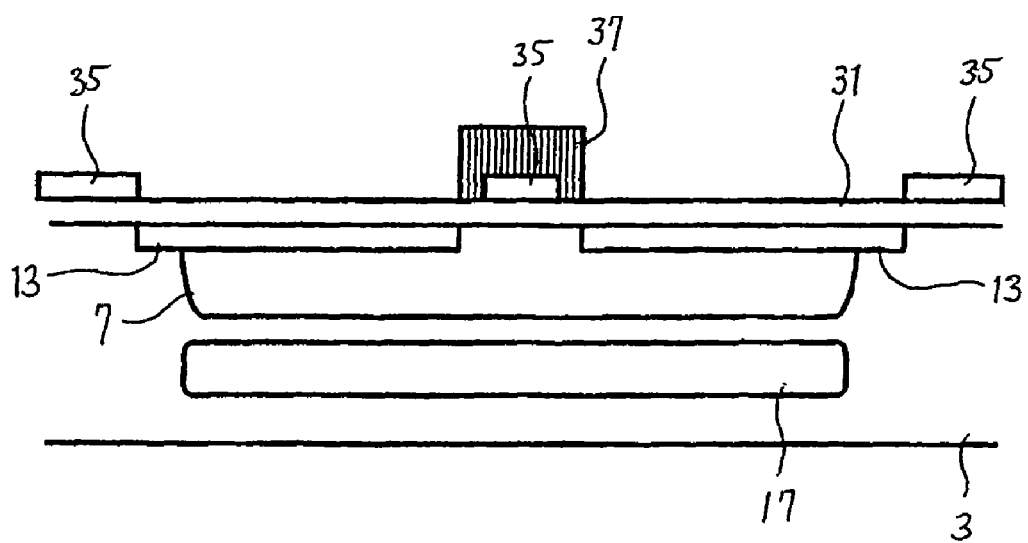
FIG. 4 is a schematic cross sectional view showing the method of manufacturing a photoelectric conversion device shown in FIG. 1.

After that, as shown in FIG. 4, a silicon nitride film 35 is formed in an active element forming region (region in which the N⁺ layer 9 and the P⁺ separation region 19 are formed) of an upper surface of the silicon oxide film 31. Using a photoresist 37 formed on the upper surface of the silicon oxide film 31 having a pattern for further defining a formation region for the shield layer 13 as a mask, boron difluoride (BF₂) ions are implanted to form the P-type shield layer 13 on the N-type photoelectric conversion region 7 (shield layer forming step). The region in which the shield layer 13 is formed is defined by the photoresist 37 and the silicon nitride film 35.

In this step, additional formation of patterns which define element isolation (P-type field dope) formation regions for MOS transistors of the CMOS circuit in the photoresist 37 enables simultaneous formation of the shield layer and a P-type field dope regions by the ion implantation.

Figure 5:
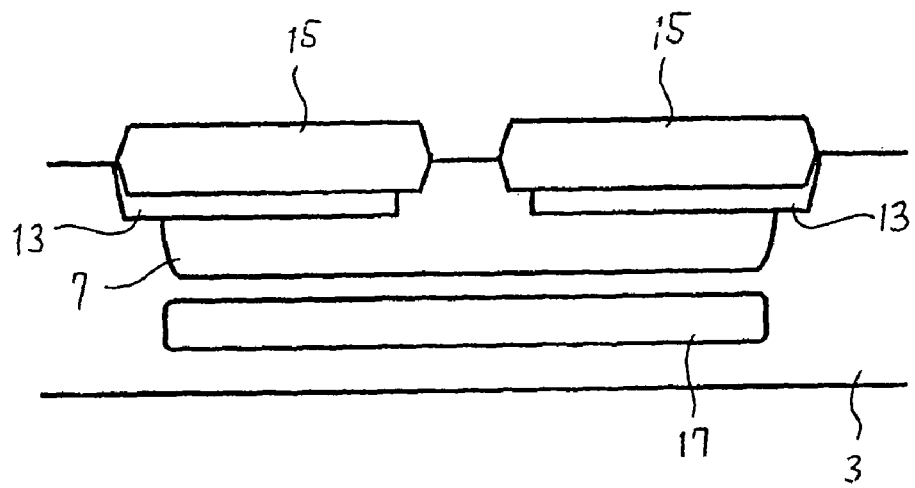
FIG. 5 is a schematic cross sectional view showing the method of manufacturing a photoelectric conversion device shown in FIG. 1.

After the completion of the shield layer forming step, the photoresist 37 is removed. Then, as shown in FIG. 5, a portion of the silicon oxide film 31 which is not coated with the silicon nitride film 35 is grown to form the field oxide film 15 whose thickness is 5000 angstroms (field oxide film forming step). After the formation of the field oxide film 15 is completed, the silicon nitride film 35 and a portion corresponding to the active element forming region, of the silicon oxide film 31 which are coated therewith are removed.

Figure 6:
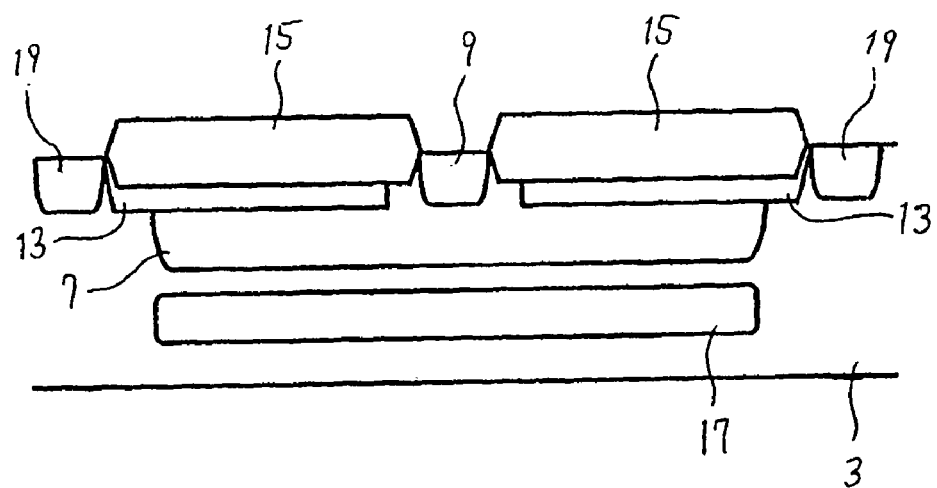
FIG. 6 is a schematic cross sectional view showing the method of manufacturing a photoelectric conversion device shown in FIG. 1.

Next, a gate oxide film (not shown) for the MOS transistors of the CMOS circuit is provided. After that, as shown in FIG. 6, gate electrodes (not shown) of the transistors are provided to form the N+ layer 9 on a portion of the photoelectric conversion region 7 in which the field oxide film 15 is not formed and to form the P+ separation region 19 on a portion of the upper surface of the P−-type semiconductor substrate 3 which is located around the field oxide film 15 (conductive layer forming step). In this step, N+ diffusion layers and P+ diffusion layers which serve as the source regions and the drain regions of the MOS transistors can be formed simultaneously with the formation of the N+ layer 9 and the P+ separation region 19.

Then, as shown in FIG. 1, the interlayer insulating film 23 is formed on the entire upper surface of the P−-type semiconductor substrate 3 including the field oxide film 15, the N+ layer 9, and the P+ separation region 19. Contact holes for connecting metal lines to the N+ layer 9, the P+ separation region 19, the gate regions of the MOS transistors, the source regions thereof, and the drain regions thereof are formed in the interlayer insulating film 23. Finally, the metal line 11 and the circular metal line 21, each of which is made of aluminum or the like, and the metal lines for the gate regions, the source regions, and the drain regions are formed in the contact holes so as to protrude from the upper surface of the interlayer insulating film 23. In addition, the insulating protective film 25 for coating the metal line 11 and the circular metal line 21 is formed. Therefore, the manufacturing of the photoelectric conversion device 1 is completed.

According to the photoelectric conversion device 1 manufactured as described above, annihilation of the photoelectrons generated in a lower side of the P−-type semiconductor substrate 3 than the buried layer 17 can be made through recombination in the buried layer 17, resulting in reduction in crosstalk of electrical charge to another photoelectric conversion region adjacent to the photoelectric conversion region 7 and an image lag in which the photoelectrons reach the same pixel 5 with a time difference equal to or longer than a predetermined time.

According to the photoelectric conversion device 1 and the manufacturing method thereof, the photoelectric conversion region 7 can be directly formed in the P−-type semiconductor substrate 3. That is, unlike the conventional case, no need for forming an epitaxial layer leads to the reduction in manufacturing cost of the photoelectric conversion device 1.

Formation of the gap between the photoelectric conversion region 7 and the buried layer 17 makes the entire lower surface of the photoelectric conversion region 7 contact with the P−-type semiconductor substrate 3, enabling construction of a photodiode having high photoelectric conversion efficiency with the photoelectric conversion region 7 and the P−-type semiconductor substrate 3.

Performing the buried layer forming step immediately after the photoelectric conversion region forming step enables formation of the buried layer 17 using the photoresist 33 for the photoelectric conversion region 7, improving the manufacturing efficiency of the photoelectric conversion device 1.

Formation of the shield layer 13 on the photoelectric conversion region 7 can prevent the electrical noise from entering the photoelectric conversion region 7 from the outside, also preventing reduction in image quality caused by the noise.

According to the above-mentioned manufacturing method, simultaneous formation of the MOS transistors of the CMOS circuits to the same P−-type semiconductor substrate 3 with the photoelectric conversion device 1 enables improvement in the manufacturing efficiency of the image sensor including the photoelectric conversion device 1 and the CMOS circuit.

Next, a second embodiment of the present invention will be described with reference to FIGS. 7 to 12. The same constituent elements as those in the photoelectric conversion device 1 according to the first embodiment are expressed by the same reference numerals and the description thereof is omitted here.

Figure 7:
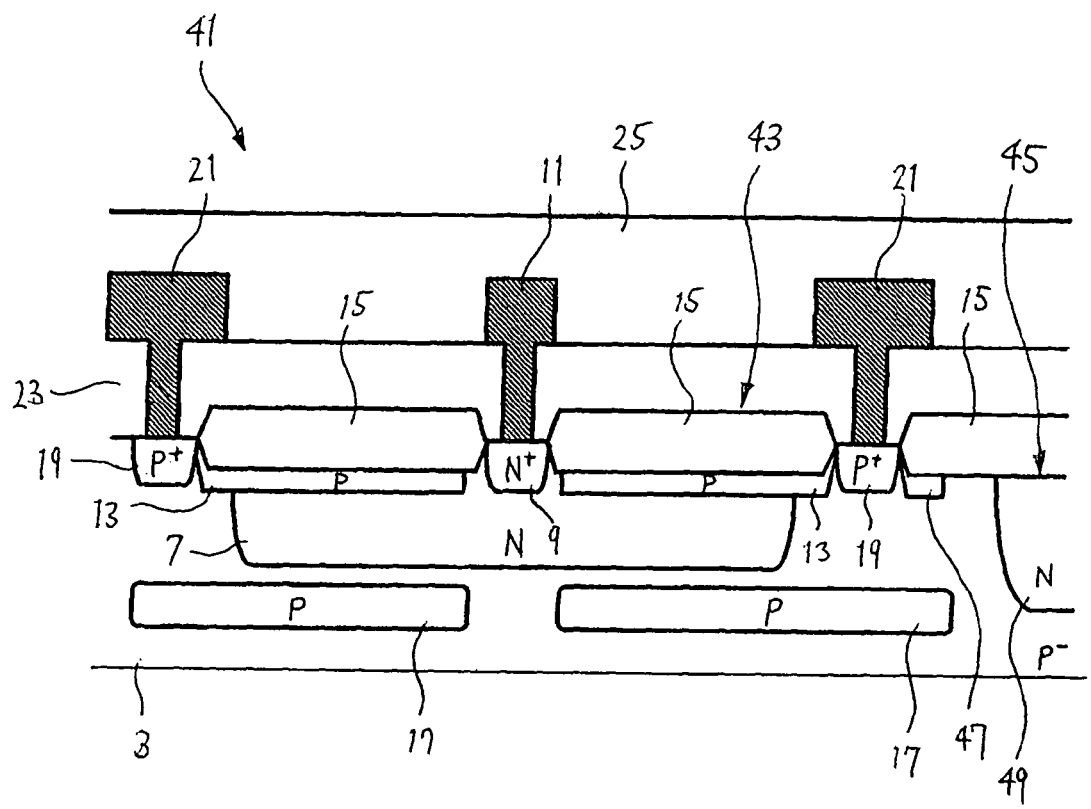
FIG. 7 is a schematic cross sectional view showing a photoelectric conversion device and a PMOS transistor in an image sensor according to a second embodiment of the present invention.

As shown in FIG. 7, in a pixel 43 of a photoelectric conversion device 41, the P-type buried layer 17 is formed so as not to overlap with the N+ layer 9 in a thickness direction of the P−-type semiconductor substrate 3. That is, the P-type buried layer 17 is formed under a portion of the photoelectric conversion region 7 which is other than the region in which the N+ layer 9 is formed. The buried layer 17 is extended to the outside of the circumference of the photoelectric conversion region 7. The circumference of the buried layer 17 is located under the P+ separation region 19 and a P-type field dope region 47 described later.

A PMOS transistor (first conductivity type MOS transistor) 45 of a CMOS circuit is provided to the P−-type semiconductor substrate 3. The PMOS transistor 45 is adjacent to the pixel 43 of the photoelectric conversion device 41 through the P+ separation region 19 and the P-type field dope region 47 which is formed adjacent thereto and serves as a P-type element isolation region.

The PMOS transistor 45 includes P+ diffusion layers (not shown) which are formed in an N-type N-well (second conductivity type well) 49 formed in the upper surface of the P−-type semiconductor substrate 3 and serve as source and drain regions thereof. The N-well 49 is separated from the buried layer 17 and the P-type field dope region 47.

An image sensor is composed of the photoelectric conversion device 41 and the CMOS circuit including the PMOS transistor 45.

Figure 8:
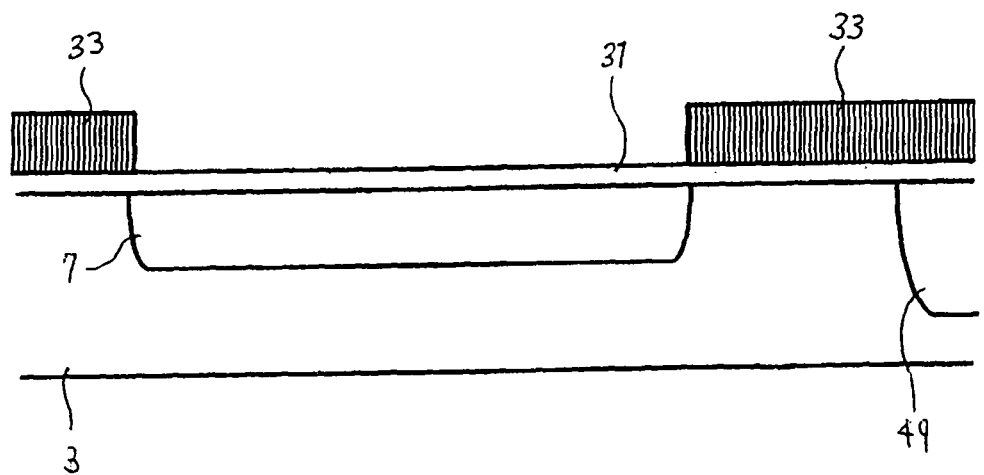
FIG. 8 is a schematic cross sectional view showing a first method of manufacturing the image sensor shown in FIG. 7.

When the image sensor having the above-mentioned structure is to be manufactured, as shown in FIG. 8, the same oxide film forming step as that in the first embodiment is fist performed to form the silicon oxide film 31, and then the N-well 49 is formed. Next, the same photoelectric conversion region forming step as that in the first embodiment is performed to form the photoelectric conversion region 7, and then the photoresist 33 is removed.

Figure 9:
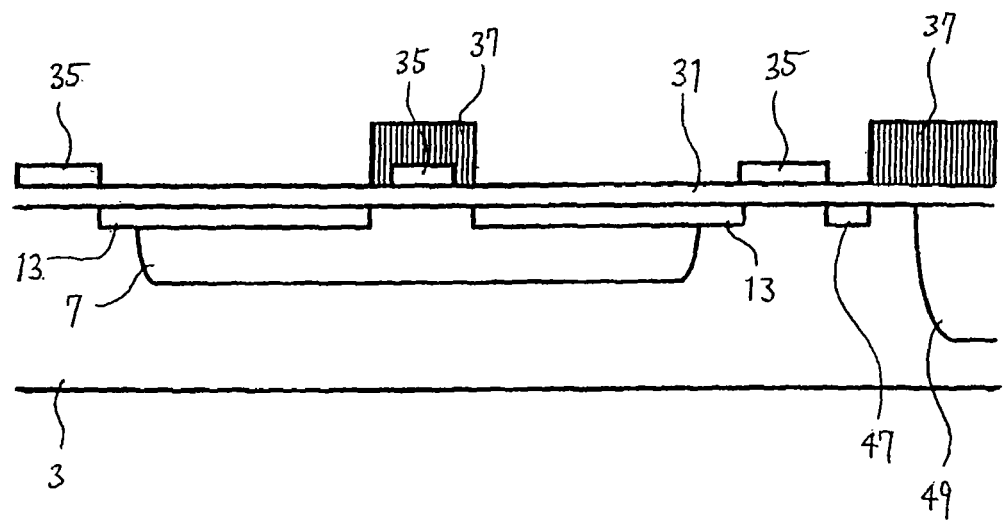
FIG. 9 is a schematic cross sectional view showing the first method of manufacturing the image sensor shown in FIG. 7.

As shown in FIG. 9, the silicon nitride film 35 is formed in the active element forming region (region in which the N+ layer 9 and the P+ separation region 19 are formed) of the upper surface of the silicon oxide film 31. After that, the same shield layer forming step as that in the first embodiment is performed to form the shield layer 13.

According to the shield layer forming step in this embodiment, the photoresist 37 is formed on a portion of the upper surface of the silicon oxide film 31 which is located above the N-well 49. A pattern for defining a region in which the P-type field dope region 47 is to be formed is also formed in the photoresist 37 in advance. The P-type field dope region 47 can thus be formed simultaneously with the formation of the shield layer 13 by implanting the boron difluoride ($BF_2$) ions in the shield layer forming step.

Figure 10:
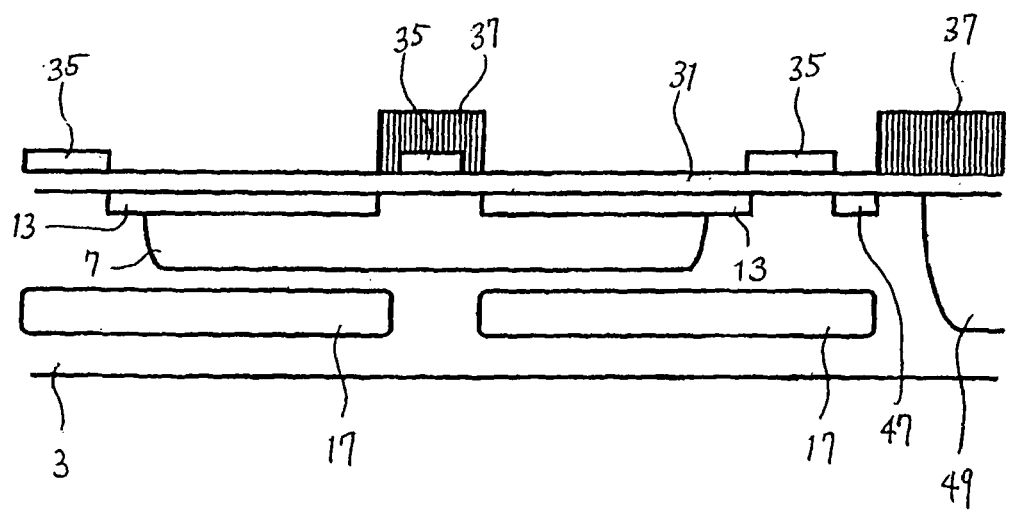
FIG. 10 is a schematic cross sectional view showing the first method of manufacturing the image sensor shown in FIG. 7.

After that, as shown in FIG. 10, while the photoresist 37 is left, the buried layer forming step as that in the first embodiment is performed to form the P-type buried layer 17 under the photoelectric conversion region 7. According to the ion implantation in this step, the boron ions pass through the silicon nitride film 35, so the buried layer 17 is formed only by the pattern of the photoresist 37. That is, the buried layer 17 is formed under the photoelectric conversion region 7 in a region that does not overlap with the photoresist 37.

Figure 11:
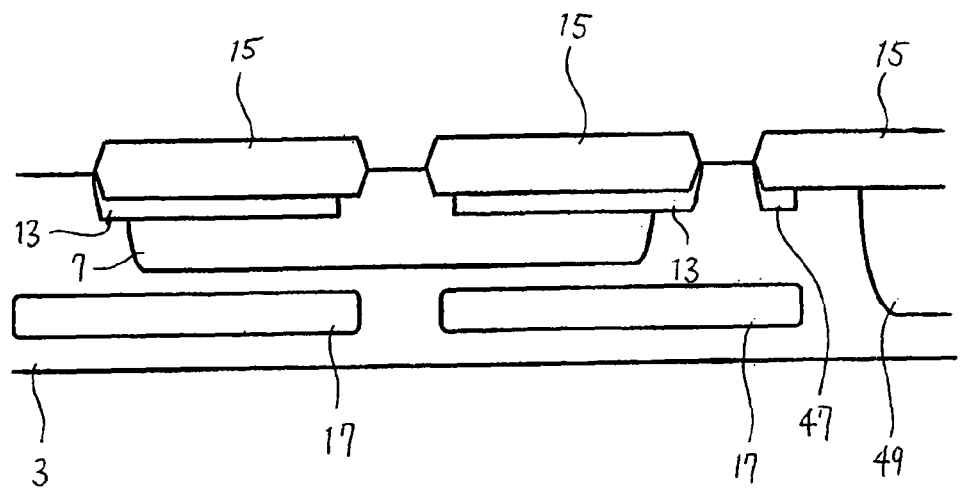
FIG. 11 is a schematic cross sectional view showing the first method of manufacturing the image sensor shown in FIG. 7.

After the completion of the buried layer forming step, the photoresist 37 is removed. Then, as shown in FIG. 11, the field oxide film forming step for growing the portion of the silicon oxide film 31 which is not coated with the silicon nitride film 35 is performed to form the field oxide film 15. After the formation of the field oxide film 15 is completed, the silicon nitride film 35 and a portion corresponding to the active element forming region, of the silicon oxide film 31 which is coated therewith are removed.

Figure 12:
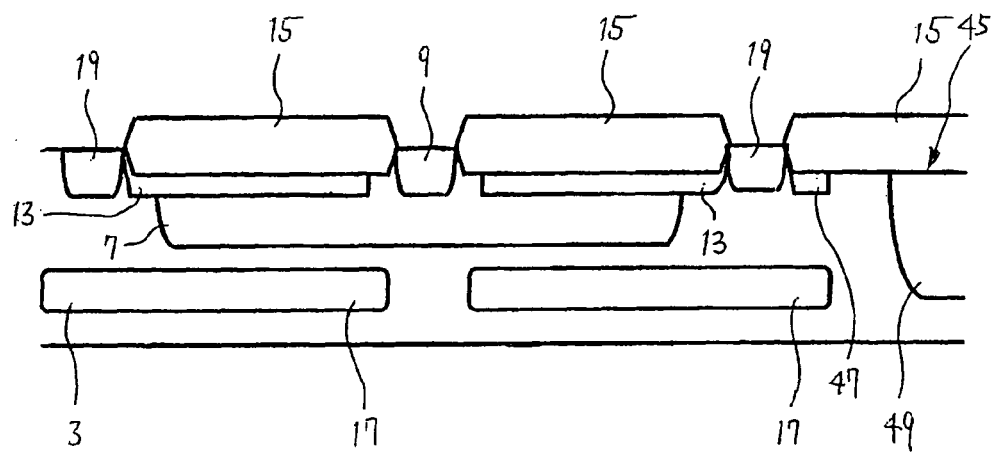
FIG. 12 is a schematic cross sectional view showing the first method of manufacturing the image sensor shown in FIG. 7.

Next, a gate oxide film (not shown) for the PMOS transistor 45 and an NMOS transistor (not shown) which are included in the CMOS circuit is formed. After that, as shown in FIG. 12, the same conductive layer forming step as that in the first embodiment is performed to form the $N^+$ layer 9 and the $P^+$ separation region 19.

In this step, $N^+$ diffusion layers and $P^+$ diffusion layers which serve as the source regions and the drain regions of the MOS transistors can be formed simultaneously with the formation of the $N^+$ layer 9 and the $P^+$ separation region 19. That is, the $P^+$ diffusion layers which serve as the source and drain regions of the PMOS transistor 45 can be formed simultaneously with the formation of the $P^+$ separation region 19.

Finally, as shown in FIG. 7, as in the first embodiment, the interlayer insulating film 23 and the insulating protective film 25 are stacked on the entire upper surface of the $P^-$-type semiconductor substrate 3. In addition, the metal line 11, the circular metal line 21, and lines for the gate regions, the source regions, and the drain regions are formed. Accordingly, the manufacturing of the image sensor which includes the photoelectric conversion device 41 and the CMOS circuit is completed.

According to the method of manufacturing the image sensor, the same effect as the first embodiment is obtained.

Performing the buried layer forming step immediately after the shield layer forming step enables formation of the buried layer 17 using the same pattern of the photoresist 37 as the shield layer 13, improving the manufacturing efficiency of the photoelectric conversion device 1.

According to the image sensor manufactured by the above-mentioned process, the N-well 49 of the PMOS transistor 45 is separated from the buried layer 17 for reducing crosstalk and an image lag, and forms a PN junction with the $P^-$-type semiconductor substrate 3 having a lower impurity concentration than the buried layer 17. Therefore, a relative impurity concentration of the PN junction can be set to a value lower than that in the conventional case. Thus, the crosstalk and the image lag can be reduced to improve an electrical withstand voltage of the N-well 49.

The order of the manufacturing process for manufacturing the image sensor is not limited to that in the second embodiment. It is only necessary to perform the shield layer forming step immediately before the buried layer forming step. That is, the image sensor manufacturing process may be performed in, for example, the following order.

Figure 13:
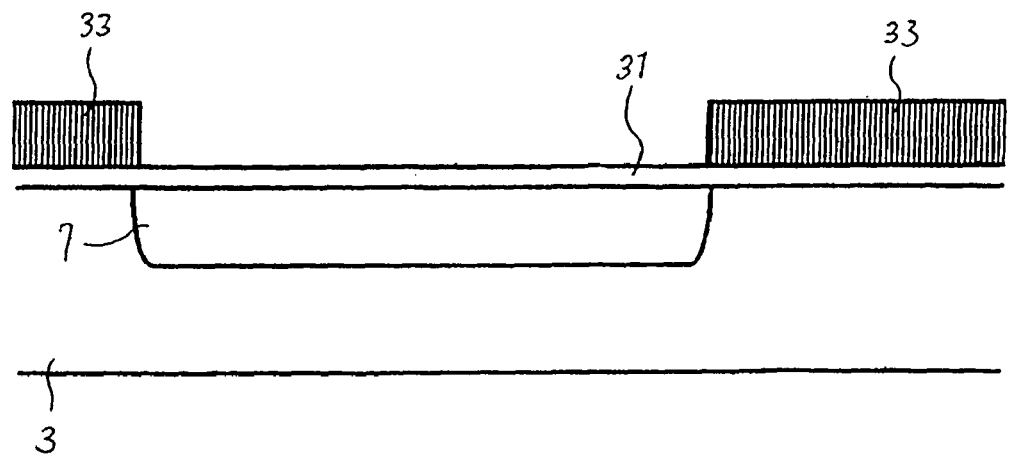
FIG. 13 is a schematic cross sectional view showing a second method of manufacturing the image sensor shown in FIG. 7.
Figure 14:
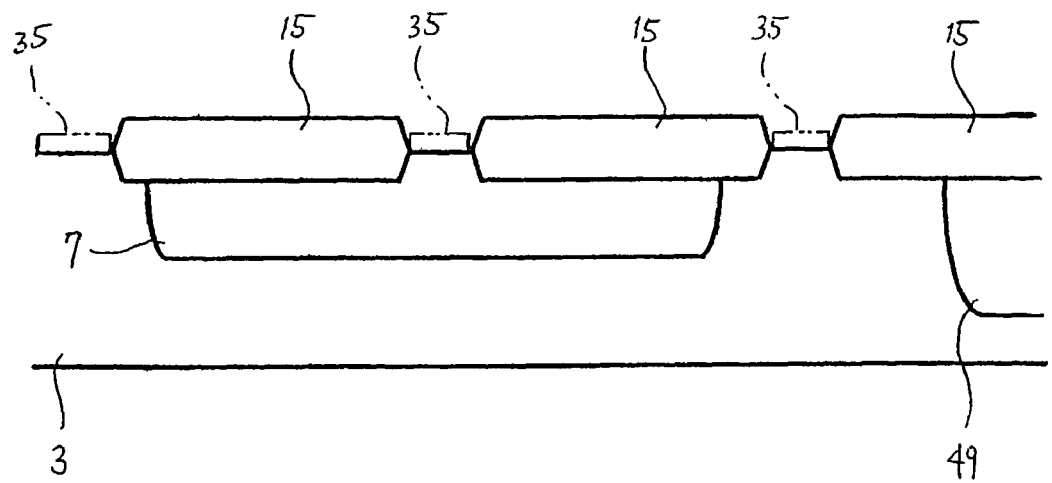
FIG. 14 is a schematic cross sectional view showing the second method of manufacturing the image sensor shown in FIG. 7.

First, as shown in FIG. 13, as in the first embodiment, the oxide film forming step is performed to form the silicon oxide film 31, and then the photoelectric conversion region forming step is performed to form the photoelectric conversion region 7 and the photoresist 33 is removed. Next, as shown in FIG. 14, while the silicon nitride film 35 is formed in the active element forming region of the upper surface of the silicon oxide film 31, the field oxide film forming step is performed to form the field oxide film 15. Then, the silicon nitride film 35 and a portion of the silicon oxide film (not shown) which is coated therewith are removed and the N-well 49 is formed. Note that the order of forming the field oxide film 15 and the N-well 49 may be reversed.

Figure 15:
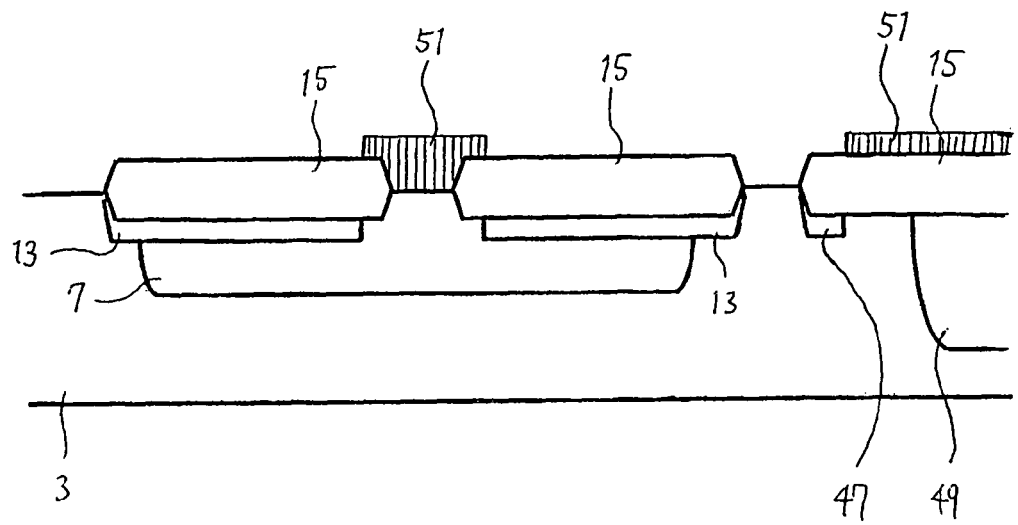
FIG. 15 is a schematic cross sectional view showing the second method of manufacturing the image sensor shown in FIG. 7.
Figure 16:
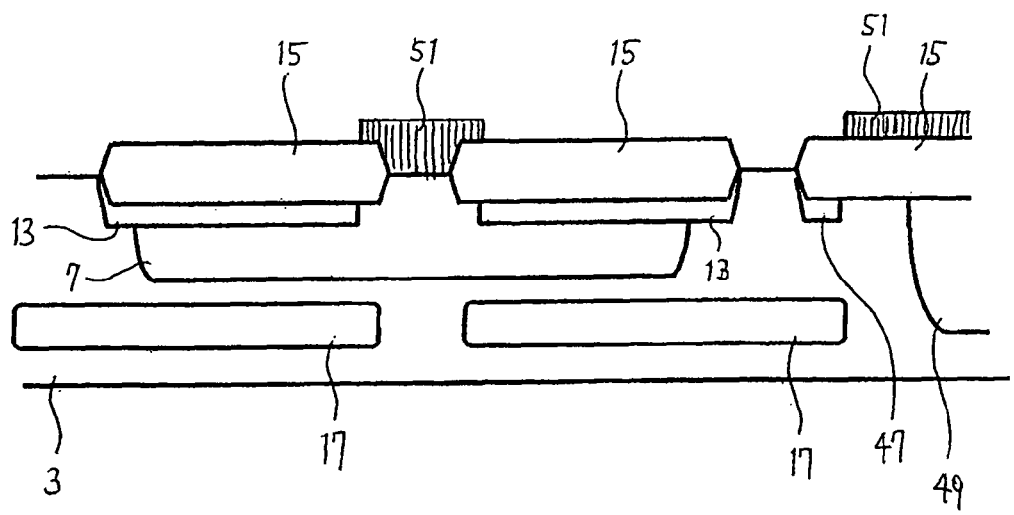
FIG. 16 is a schematic cross sectional view showing the second method of manufacturing the image sensor shown in FIG. 7.

After the formation of the field oxide film 15 and the N-well 49, as shown in FIG. 15, as in the second embodiment, the shield layer forming step is performed using a photoresist 51 to form the shield layer 13 and simultaneously form the P-type field dope region 47 using the photoresist 51.

While the photoresist 51 is left, the buried layer forming step is performed to form the P-type buried layer 17 under the photoelectric conversion region 7. After the completion of this step, the photoresist 51 is removed.

After that, as in the second embodiment, a gate oxide film (not shown) for the MOS transistors is formed. As shown in FIG. 12, the conductive layer forming step is performed to form the $N^+$ layer 9 and the P+ separation region 19 and further form the $N^+$ diffusion layers and $P^+$ diffusion layers which serve as the source regions and the drain regions of the MOS transistors. Finally, as shown in FIG. 7, the interlayer insulating film 23 and the insulating protective film 25 are stacked on the entire upper surface of the $P^-$-type semiconductor substrate 3. In addition, the metal line 11, the circular metal line 21, and the lines for the gate regions, the source regions, and the drain regions are formed. Therefore, the manufacturing of the image sensor is completed.

In each of the above-mentioned embodiments, the P-type buried layer 17 is located with the gap from the N-type photoelectric conversion region 7. However, the present invention is not limited to this. It is only necessary that the P-type buried layer 17 be formed in the inner portion of the $P^-$-type semiconductor substrate 3 so as to cover the lower side of the N-type photoelectric conversion region 7. That is, the P-type buried layer 17 may be joined with the N-type photoelectric conversion region 7.

In each of the embodiments, the conductivity type of each layer may be reversed. That is, for example, the $P^-$-type semiconductor substrate 3, the N-type photoelectric conversion region 7, and the P-type buried layer 17 may be replaced by an $N^-$-type semiconductor substrate, a P-type photoelectric conversion region, and an N-type buried layer, respectively.

The embodiments of the present invention are described with reference to the attached drawings. Specific structures are not limited to the structures described in the embodiments and thus design modifications and the like which are made without deviating from the spirit of the present invention are included in the present invention.

What is claimed is:

1. A method of manufacturing a photoelectric conversion device, comprising:

forming a photoelectric conversion region of a second conductivity type opposite to a first conductivity type in a semiconductor substrate of the first conductivity type;

forming a silicon nitride film only in an active element forming region;

forming a first conductivity type shield layer close to a surface of the second conductivity type photoelectric conversion region located under an oxide film;

forming a buried layer of the first conductivity type in an inner portion of the semiconductor substrate to cover a lower side of the photoelectric conversion region, the buried layer having a higher impurity concentration than the semiconductor substrate:

forming a field oxide film and then removing the silicon nitride film and a portion of the oxide film which is located under the silicon nitride film;

forming a gate oxide film in the active element forming region;

forming a gate electrode on a portion of the gate oxide film; and forming a first conductivity type diffusion layer and a second conductivity type diffusion layer in the active element forming region.

2. A method of manufacturing a photoelectric conversion device according to claim 1, wherein the first conductivity type shield layer is electrically connected with the semiconductor substrate, wherein the first conductivity type shield layer forming step is performed immediately before or after the buried layer forming step.

3. A method of manufacturing a photoelectric conversion device, comprising:

forming an oxide film on an upper surface of a first conductivity type semiconductor substrate;

forming a second conductivity type photoelectric conversion region on an upper surface side of the first conductivity type semiconductor substrate;

forming a first conductivity type buried layer under the second conductivity type photoelectric conversion region in self-alignment with the second conductivity type photoelectric conversion region;

forming a silicon nitride film only in an active element forming region;

forming a first conductivity type shield layer close to a surface of the second conductivity type photoelectric conversion region located under the oxide film in self-alignment with the silicon nitride film;

forming a field oxide film and then removing the silicon nitride film and a portion of the oxide film which is located under the silicon nitride film;

forming a gate oxide film in the active element forming region;

forming a gate electrode on a portion of the gate oxide film; and forming a first conductivity type diffusion layer and a second conductivity type diffusion layer in the active element forming region.

* * * * *